United States Patent
Becker et al.

(10) Patent No.: US 7,897,879 B2
(45) Date of Patent: Mar. 1, 2011

(54) CERAMIC SUBSTRATE GRID STRUCTURE FOR THE CREATION OF VIRTUAL COAX ARRANGEMENT

(75) Inventors: Wiren D. Becker, Hyde Park, NY (US); Zhaoqing Chen, Poughkeepsie, NY (US); George Katopis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 12/259,811

(22) Filed: Oct. 28, 2008

(65) Prior Publication Data

US 2009/0108465 A1 Apr. 30, 2009

Related U.S. Application Data

(63) Continuation of application No. 11/610,082, filed on Dec. 13, 2006, now Pat. No. 7,465,882.

(51) Int. Cl.
*H05K 1/03* (2006.01)
(52) U.S. Cl. ........................ 174/261; 174/260; 174/262; 361/816; 361/818; 361/790; 361/785
(58) Field of Classification Search ................. 174/255, 174/260–262, 350, 397; 361/816, 818, 790, 361/795
See application file for complete search history.

(56) References Cited

U.S. PATENT DOCUMENTS 4,038,040 A 7/1977 Nagl (Continued)

OTHER PUBLICATIONS

Office Action for U.S. Appl. No. 11/610,082 dated Aug. 15, 2007.

(Continued)

*Primary Examiner*—Tuan T Dinh
*Assistant Examiner*—Andargie M Aychillhum
(74) *Attorney, Agent, or Firm*—Dennis Jung, Esq.; Kevin P. Radigan, Esq.; Heslin Rothenberg Farley & Mesiti P.C.

(57) ABSTRACT

Signal line conductors passing through vertical vias in an insulative substrate for supporting and interconnecting integrated circuit chips are provided with shielding conductors in adjacent vias that link respective power and ground planes. The shielding conductors' presence in positions around a signal via is made possible through the employment of power plane and ground plane conductive grids that are laid out in rhomboid patterns. The power plane and ground plane grids possess a left-right mirror relation to one another and are displaced to place the rhomboid's corners to avoid overlapping any of the grid lines.

20 Claims, 9 Drawing Sheets

U.S. PATENT DOCUMENTS

| | | |
|---|---|---|
| 4,700,016 A | 10/1987 | Hitchcock et al. |
| 5,675,299 A * | 10/1997 | Suski ............................ 333/1 |
| 5,812,380 A | 9/1998 | Frech et al. |
| 5,831,836 A | 11/1998 | Long et al. |
| 6,150,895 A | 11/2000 | Steigerwald et al. |
| 6,373,719 B1 * | 4/2002 | Behling et al. .............. 361/816 |
| 6,483,714 B1 | 11/2002 | Kabumoto et al. |
| 6,657,130 B2 | 12/2003 | Van Dyke et al. |
| 6,750,732 B2 | 6/2004 | Ikami |
| 6,900,395 B2 | 5/2005 | Jozwiak et al. |
| 7,348,667 B2 | 3/2008 | Chun et al. |
| 2001/0010271 A1 | 8/2001 | Lin et al. |
| 2006/0022310 A1 | 2/2006 | Egitto et al. |

OTHER PUBLICATIONS

Office Action for U.S. Appl. No. 11/610,082 dated Feb. 7, 2008.
Office Action for U.S. Appl. No. 12/269,082 dated Jun. 8, 2010.

* cited by examiner

CERAMIC SUBSTRATE GRID STRUCTURE FOR THE CREATION OF VIRTUAL COAX ARRANGEMENT

CROSS-REFERENCE TO RELATED APPLICATION

This application is a continuation of co-pending U.S. patent application Ser. No. 11/610,082, filed Dec. 13, 2006, entitled "Ceramic Substrate Grid Structure for the Creation of Virtual Coax Arrangement", by Becker et al., the entirety of which is hereby incorporated herein by reference.

TECHNICAL FIELD

This invention relates in general to substrates to which integrated circuit chips are affixed so as to provide interconnectivity between the chips and with other circuits and systems external to the substrate. More particularly, the present invention is directed to a to a configuration of ground plane and power plane conductors which reduce cross coupling, lowers losses and permits higher frequency operation. Even more particularly, the present invention is directed to a configuration of conductive via paths which act essentially as a coaxial shielding arrangement. (A "via" is a vertical path in the substrate through which conductive material therein carries electrical power and signals.) It is also noted that the present invention is particularly useful with glass ceramic substrates; however, the conductive configurations of the present invention are employable in conjunction with any insulative substrate material including polymeric materials.

BACKGROUND OF THE INVENTION

It is well known that with the continuing shrinkage of electronic circuit components, there is a concomitant need for operation at higher frequencies. At these higher frequencies, cross coupling between physically adjacent conductive paths becomes a greater problem. It is expected that chip-to-chip interconnections will require a one gigabit per year increase in the data rate. To achieve this goal it is desirable to further improve packaging structures in the first and second levels of packaging in order to support advanced circuit designs. This means that the losses and coupled noise attributes of the interconnect systems should be reduced relative to the current design. For glass ceramic MCMs (MuliChip Modules) the signal line losses are virtually zero. However, this makes the contribution of the coupled noise, to support the higher data rates, even more pronounced. The severity of this problem is highlighted in the Apr. 11, 2005 issue of EE Times.

SUMMARY OF THE INVENTION

In the present invention, the coupled noise for the x, y and z interconnects is controlled by reducing signal density by adding EM (Electromagnetic) shielding to the traces (that is, to the conductive paths). In the present invention a manufacturable geodetic approach is employed as a solution of the problem. The structure of the present invention reduces the coupled noise interaction for both the vertical and the x-y plane interconnects by a factor of from four to six, while at the same time minimizing wirability problems.

The solution proposed herein creates a virtual coax (that is, coaxial conductor) arrangement for the vertical signal interconnections and by doing so it allows their operation at a data rate that is two to three times higher than existing technology.

A central aspect of the present invention is the replacement of the usual orthogonal grid array currently used for the power supply planes of glass ceramic substrate modules by a geodetic structure of equilateral triangles implemented trough the use of rhomboid shapes so that the manufacturing complexity is not increased. Specific spacing of these shapes allows their construction within the current ground rules of ceramic technology. The displacement of the rhombus shapes among the different planes minimizes the loss of wiring density, while at the same time it reduces the coupled noise by a factor of four. In addition, calculations indicate that the proposed structure reduces the average interconnect latency by 16.6%.

In accordance with one aspect of the present invention a structure for providing electrical interconnection for integrated circuit chips comprises an insulative substrate wherein at least one conductive layer within the substrate (say a ground layer) has two sets of parallel conductors crossing each other in a substantially rhomboid shaped pattern. A second conductive layer within the substrate is patterned in substantially the same way but in a mirror image patter. Nonetheless, it too possesses a substantially rhomboid shaped pattern. The second layer is displaced horizontally from the first layer. One or two signal layers are disposed between the ground plane and power plane layers.

Furthermore, it is noted that while the description herein focuses upon a situation in which there are only three or four layers, in practice such substrates include many tens of layers, with 30 layers being typical for the ones contemplated herein. When reference is made herein to a "vertical" direction, it should be understood that this is a relative term referring to a direction from one conductive plane in the substrate to another. It is also understood that while the present invention is best used with thicker glass or glass ceramic substrates, the advantages obtained apply also to polymeric substrates.

Additional features and advantages are realized through the techniques of the present invention. Other embodiments and aspects of the invention are described in detail herein and are considered a part of the claimed invention.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 6 is a view similar to FIG. 2 but which more particularly illustrates the grid line dimensioning parameters as a function of the technology parameter dimension, a;

DETAILED DESCRIPTION

Figure 1:
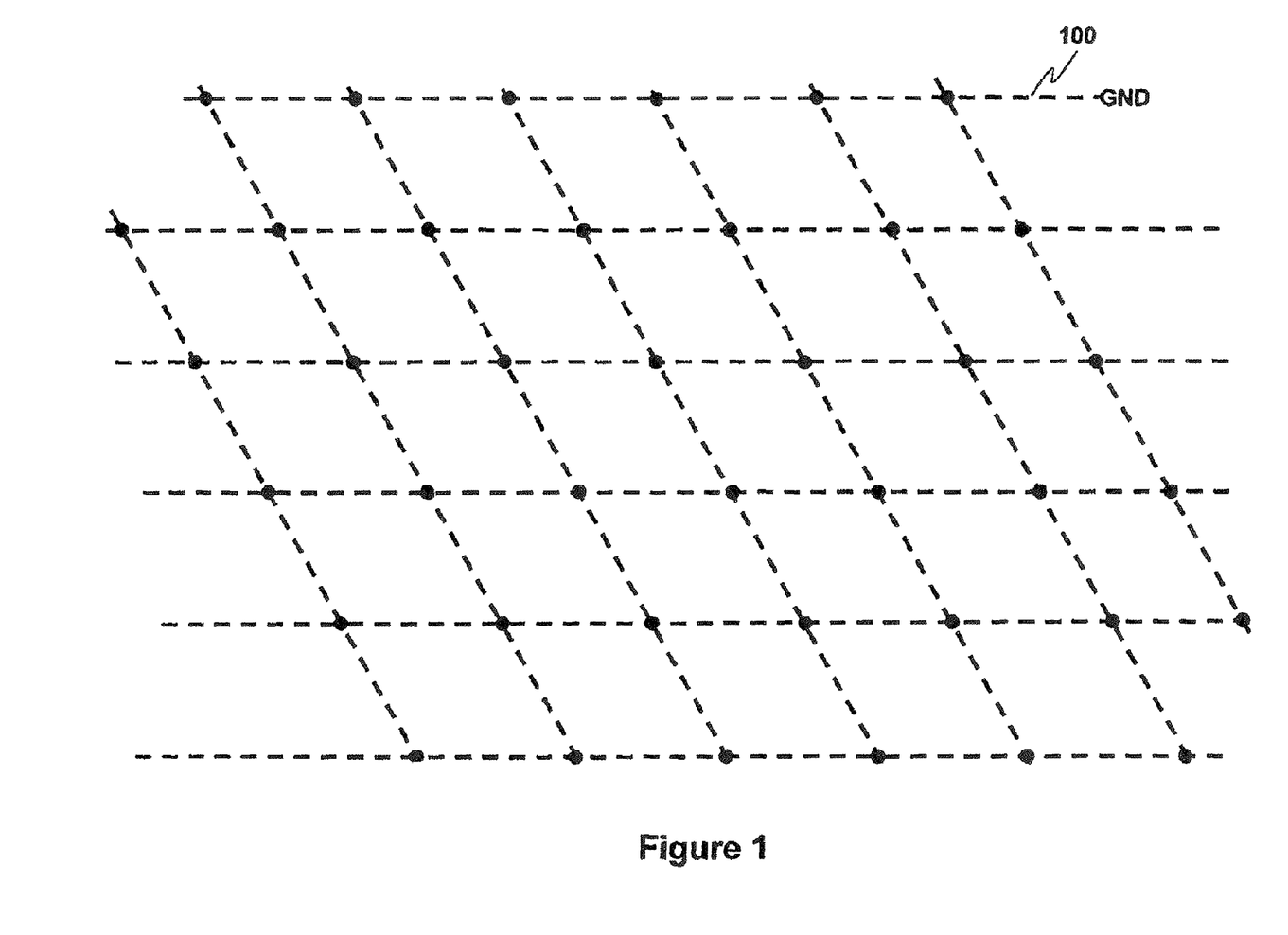
FIG. 1 is a top view of the desired grid line structure for one of the conductive power planes in a substrate to which integrated circuit chips are affixed.

FIG. 1 is a top view of the patterns of conductive lines in one of the layers of a substrate used for providing the ground voltage to the interconnected circuit chips. For illustrative purposes only, this particular layer is referred to a ground plane or ground plane layer. Typically, one of these substrates includes a plurality of layers having various patterns of conductors. In conventional substrate designs these conductors are arranged in orthogonal patterns. In such substrates there are typically three different kinds of layers: ground plane layers, power plane layers and signal layers. The signal layers are typically found between a ground plane layer and a power plane layer. However, there is no hard and fast rule specifying the number of signal layers present.

For purposes of illustration, it is assumed that the layer shown in FIG. 1 is a ground plane layer and it is designated by reference numeral 100. It is a significant feature of the present invention is that the conductive patterns present in FIG. 1 are configured to produce rhomboid shaped regions between the conductors. At the intersections of the conductive lines shown in FIG. 1, the circular dots represent the presence of a via opening to a conductive pattern in another layer of the substrate. It is not a requirement of the present invention that all of these vias are in fact occupied by conductive material, which provides an electrically conductive path between layers. It should be appreciated that in any given substrate there may be present a plurality of ground plane layers and a plurality of power plane layers. The vias are employed to electrically connect the ground planes in each different layer. The same is true for power plane layers, as is seen in the discussion below.

Figure 2:
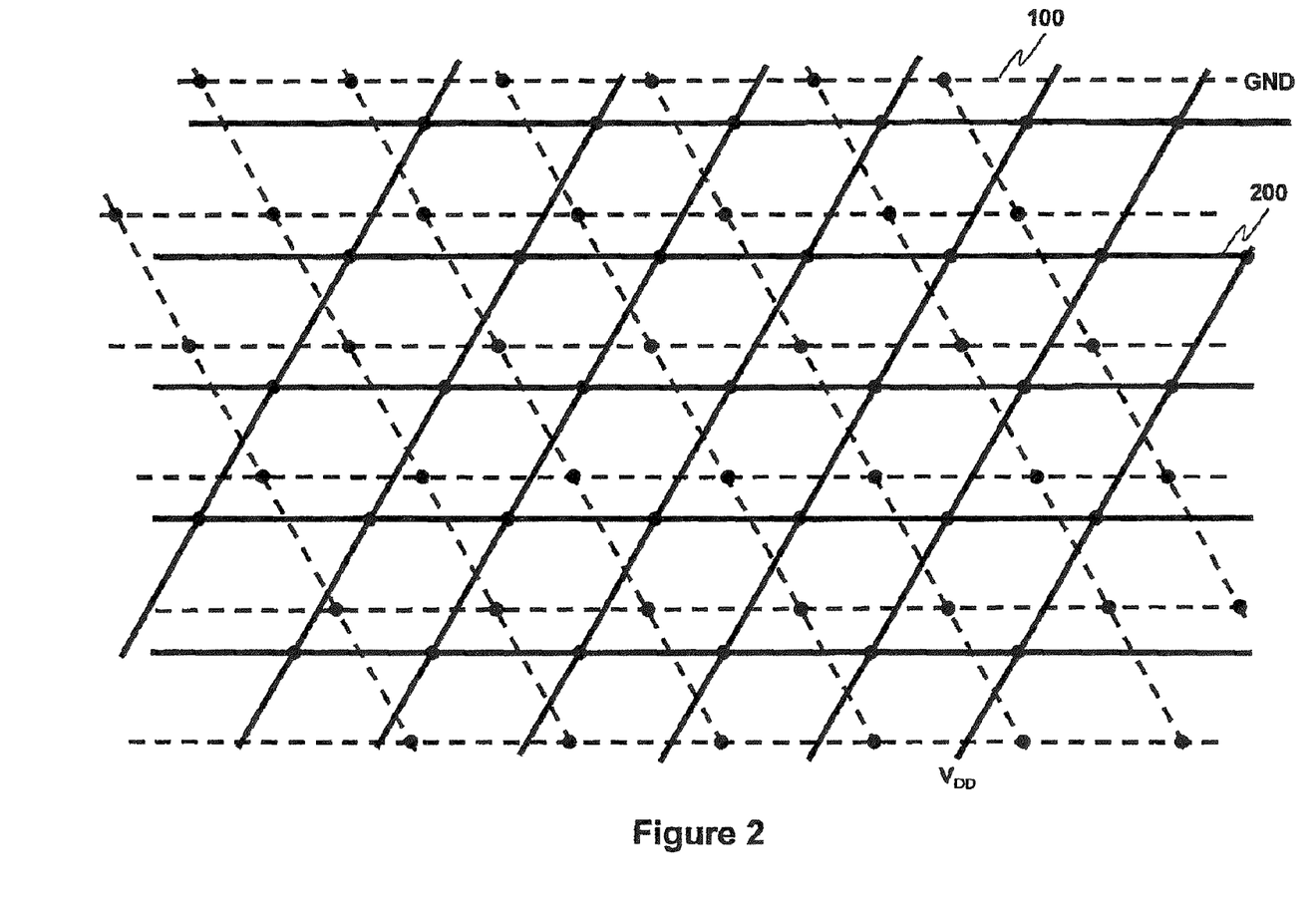
FIG. 2 is a view similar to FIG. 1 but now showing the relation between the desired grid structure as between the ground plane and the power plane.

FIG. 2 illustrates the presence of a second layer of conductive patterns. For explanatory purposes only, it is assumed that this second layer (200) is a power plane layer. Just as with ground plane layers, typical substrates include a plurality of power plane layers as a mechanism for distributing power to various ones of the integrated circuit chips connected to an upper or lower surface of the substrate. Likewise, ground level voltage potentials are provided throughout the substrate by means of vias which connect ground planes in different layers at the bottom of the substrate in question.

It is particularly noted that the conductive patterns shown in FIG. 2 for a power plane layer are also disposed in a fashion in which the conductors form rhomboid shaped areas, as in FIG. 1. However, it is important to note that, for the second layer the conductive patterns forming the power plane include conductors which are essentially disposed in a mirror image fashion as compared to the patterns shown in FIG. 1. It is also important to note that, as between the patterns in the two layers there is a displacement that exists. For example, it is noted that the corner vertices of each of the rhombus patterns in FIG. 2 lies at a point which is not directly above the vertex of the conductive patterns for the ground plane below it. Furthermore, just for the sake of clarity, it is worthy to note that the references to "up" and "down" are merely relative and are employed herein only for the sake of convenience.

Throughout the discussion herein the ground plane is indicated by a plurality of conductors shown as dashed lines. In contrast power plane conductors are shown as solid lines. In typical conditions, the voltage $V_{DD}$ is found to be present on the power plane conductors.

It is also noted that the conductive patterns present in the power plane layer also include vias at the vertices of the rhombus patterns. As with the ground plane structure, these vias are employed to provide power to different layers within the substrate. As indicated above, substrates typically employ a plurality of such layers. However it is noted that in order to appreciate and understand the structure and operation of the present invention, it is sufficient to describe the structure present in only three or four layers.

Figure 3:
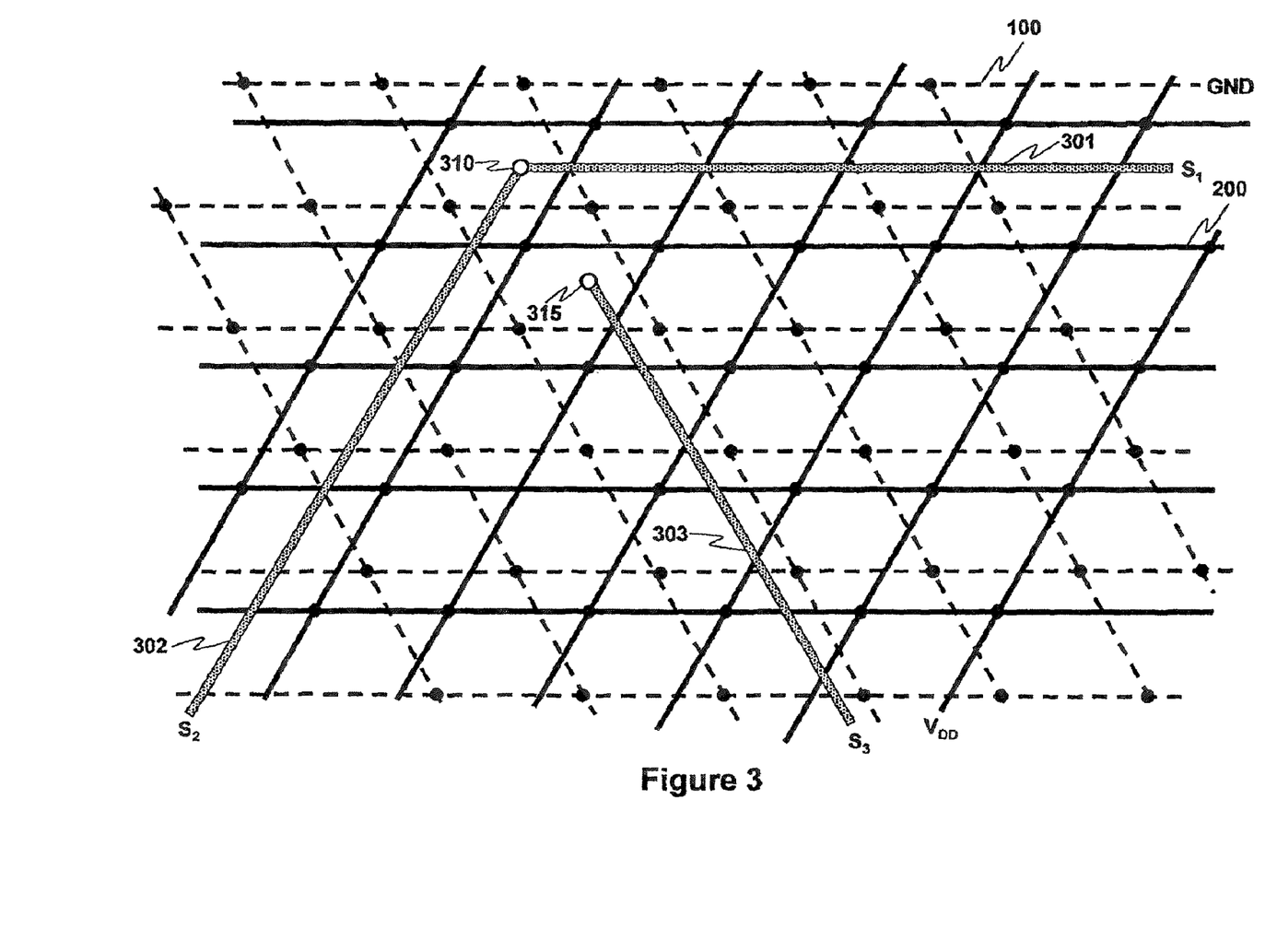
FIG. 3 is a view similar to FIG. 2 except that signal lines are now included and are located in two planes between the power planes shown in FIG. 2.

FIG. 3 illustrates the placement of signal paths 301, 302 and 302 in the substrate structures of the present invention. Though not evident from the illustration in FIG. 3, the signal lines shown are present in two signal layers that exists between power plane layer 200 and a ground plane layer 100. For example, see FIG. 7. Furthermore, it is noted that the advantages provided by the present invention are in fact best illustrated by assuming that the signal lines, $S_1$, $S_2$ and $S_3$ (301, 302 and 302) shown in FIG. 3 lie in two or three different layers. For example, it is not uncommon for several signal layers to be present between a ground plane layer and a power plane layer.

When one employs the pattern of conductive lines, as shown in FIGS. 2 and 3, certain advantages are gained. In particular, it is noted that the routing of signal conductors within the signal planes can be carried out using more direct routes, thus shortening the signal path. A shortened signal path has two significant advantages: lower losses and the ability to operate at a higher circuit speed.

Figure 4:
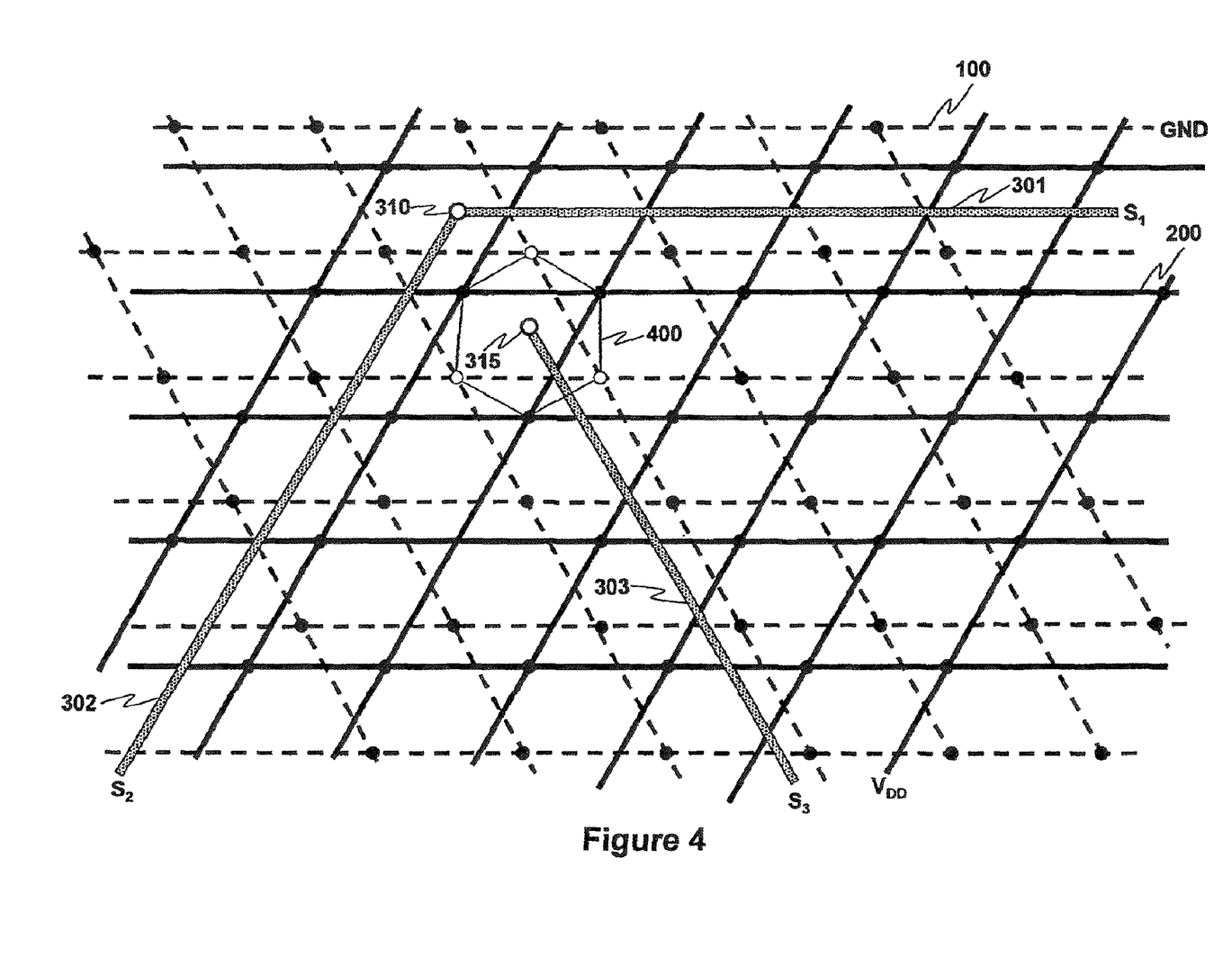
FIG. 4 is a view similar to FIG. 3 but now illustrating the presence of conductive structures that provide a virtual coaxial shielding configuration for the signal path coming from the bottom or top of the packaging structure.

In addition to the advantages provided solely by the use of the rhomboid patterns shown in FIGS. 1 through 4, there is an additional advantage that accrues with respect to the vertical via connections. Conductors through the vias connecting respective ones of the power and ground planes together provide a virtual coaxial shielding arrangement for the vertical part of the signal paths. This is illustrated in FIG. 4 and is shown in even more detail in FIG. 5. Before discussing FIG. 5, however, it is particularly noted that vertical signal paths 310 and 315 are shown as open circles in FIG. 4. In addition, conductive pattern 400, which is substantially hexagonal in shape (although any repeatable shape is employable), is employed in the power plane and in the ground plane layers to provide additional structure to produce a the coaxial shielding configuration. It should be noted that since FIG. 4 is a top view the pattern of 400, FIG. 4 is meant to suggest the pattern that is visible in the upper layer which in this case is power plane 200.

Figure 5:
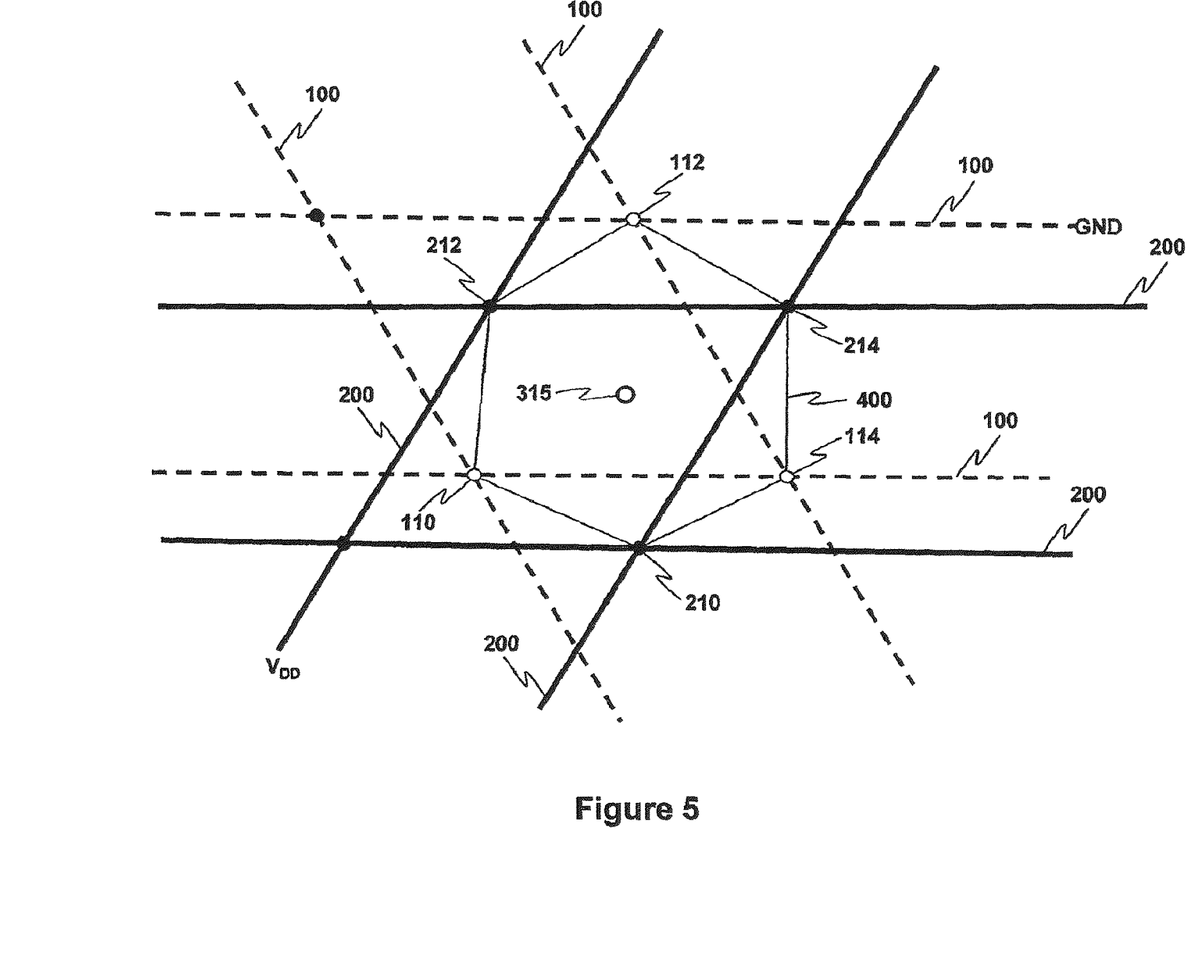
FIG. 5 is a view which shows, in an enlarged fashion, a portion of a desired coaxial shielding structure to demonstrate the placement of the vertical power connections for the ground and supply voltage planes.

In order to better understand the virtual coaxial structure provided by the present invention, FIG. 5 is presented as an enlargement of a portion of the structure shown in FIG. 4. In particular is noted that a single signal line is shown as being present. There are vias connecting the ground planes and there are separate vias through which the power planes are connected. The ground plane vias are shown as open circles in FIG. 5 and are designated by reference numerals 110, 112 and 114. Likewise, power plane 200 is connected to other power plane levels by means of vias 210, 212 and 214. As in FIG. 4 conductive structure 400, as shown, represents a structure that is present in any one of the ground or power planes (or at least in the ones through which an effectively shielded signal line passes). In preferred embodiments of the present invention, (hexagonal) conductive structure 400, visible in FIGS. 4 and 5 only in power plane 200, is present in other ones of the ground or power planes, as needed or desired. This conductive pattern surrounds signal line via 315 to whatever extent necessary with respect to its vertical passage through the insulative substrate.

Figure 6:
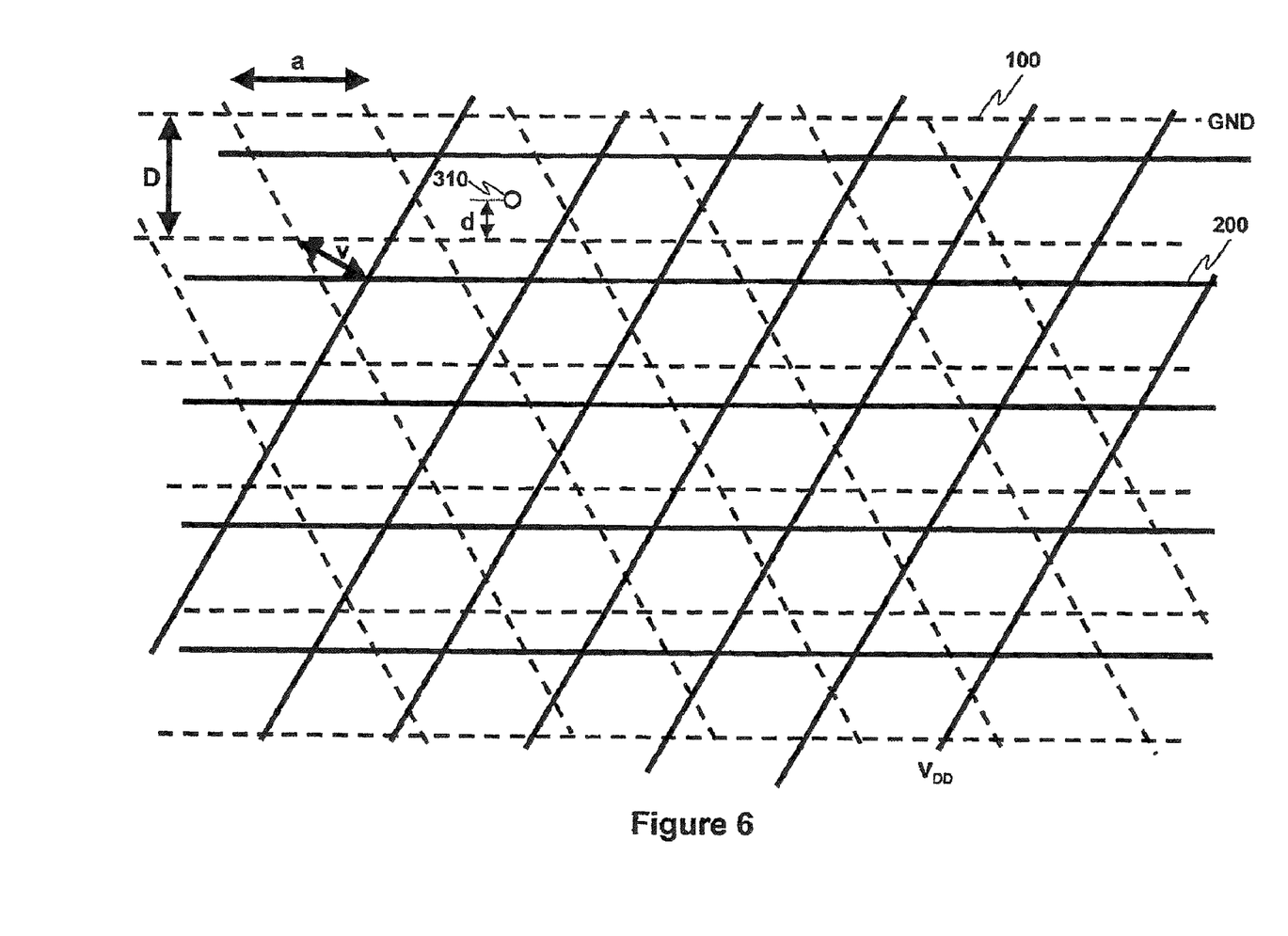

One of the advantages of the present invention, is that it is scalable. In particular, the dimensions that may be assigned to the grid are a function of a single parameter. This is illustrated in FIG. 6. There are four dimensions illustrated for the grid shown. However, the most important one is the distance a which represents a fundamental grid spacing. The other dimensions shown are selectable as a function of the single parameter a. The other parameters are D, d and v. The parameter D is the altitude of the rhomboid areas shown. The parameter d is the (vertically projected) distance between signal line vias and ground plane conductors, as shown. The parameter v is the (vertically projected) distance between rhomboid vertices in the ground plane and in the power plane. To be slightly more precise this distance is the distance between via openings for the ground plane and power planes. Again in FIG. 6, open circle 310 represents a signal line via.

In preferred embodiments of the present invention, the following represents the relationship between the distance parameters shown in FIG. 6 and the so-called technology parameter a:

$$D=0.8667a;$$

$$d=0.2887a;$$

$$v=0.5774a.$$

Figure 7:
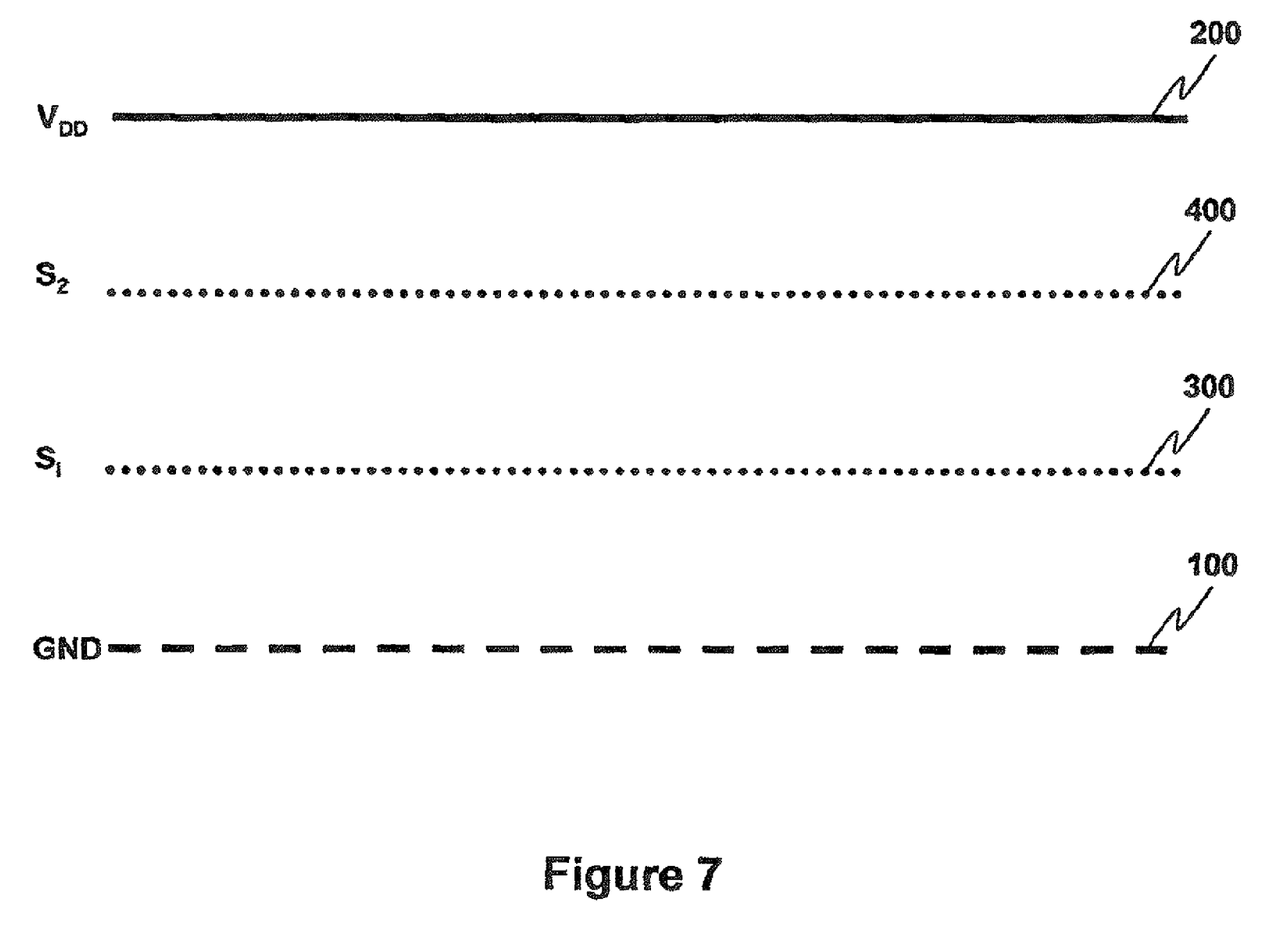
FIG. 7, in contrast to the top views above, is a side elevation view illustrating the relations amongst a representative sample of the ground, signal and power planes wherein one or two planes carrying signal lines are sandwiched between two power planes but it is note that, for higher signal frequencies, only one signal plane is used.

In order to provide a better appreciation of the fact that the various conductive layers present in the substrate exist in different planes, FIG. 7 is shown. FIG. 7 provides a side elevation view illustrating conductors 200 in the power plane, conductors 300 and 400 in two signal planes, and conductors 100 in the ground plane. As indicated above, these are merely representative layers, and in fact, any given a substrate typically employs tens of layers with power planes and ground planes being connected to one another, respectively through via openings in the substrate material. While FIG. 7 shows the presence of only a single signal plane 300, it is not all unusual to have several signal planes present between a ground plane and a signal plane.

Figure 8:
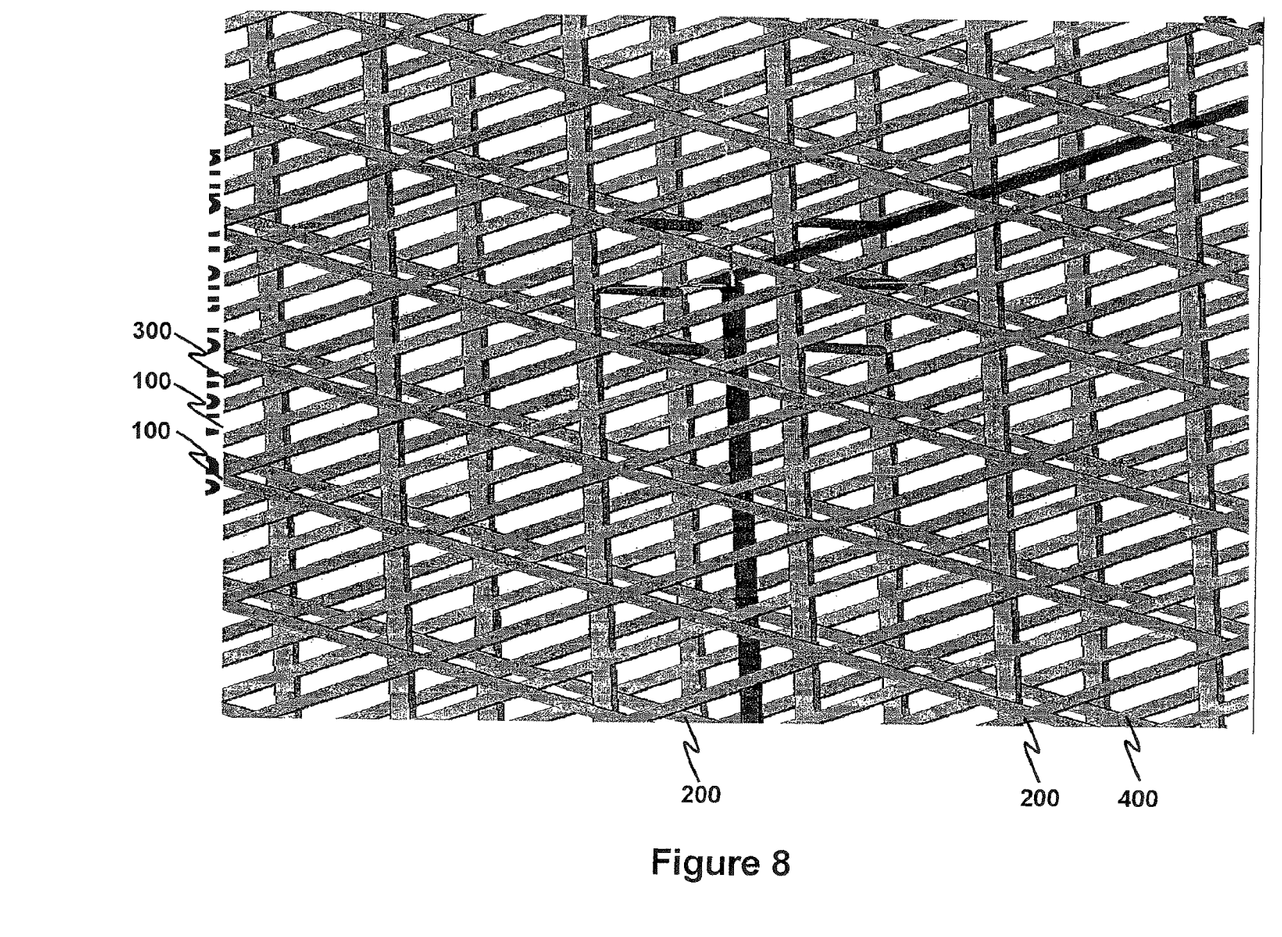
FIG. 8 is an isometric three dimensional view illustrating the coaxial shielding structure.
Figure 9:
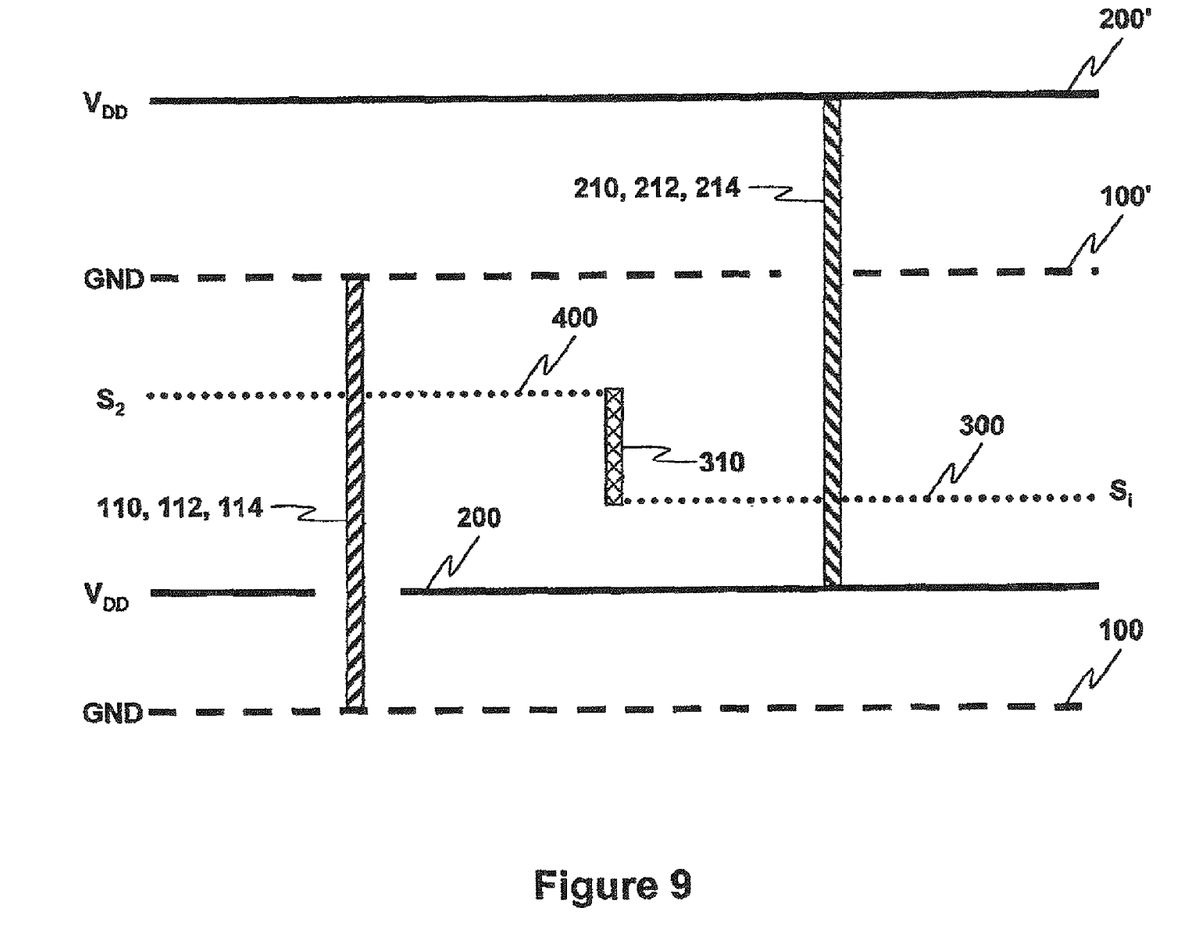
FIG. 9 is a side, projection view of a portion of the substrate illustrated in FIG. 8 which provides a slightly different view and which seeks to emphasize, as much as possible, the coaxial shielding aspects of the present invention.

FIG. 8 is a isometric three-dimensional view, which particularly illustrates the use of power plane and ground plane vias as a mechanism for providing a coaxial shielding configuration for vertical signal paths. Because of the complexity of FIG. 8, FIG. 9, as discussed below, should also be considered at the same time when attempting to construe the structure shown in FIG. 8. This three-dimensional figure includes a lower ground plane grid 100. Through vias 110, 112 and 114 (and the conductors therein), the conductive grid in this layer is electrically connected to correspondingly laid out conductors 100' in a higher layer (see FIG. 9). Likewise, power conductors 200, lying in a plane above the ground plane, but insulated therefrom by the substrate material, are connected to corresponding power conductors 200' in a superior layer. This connection is made through vias 210, 212, and 214 as seen in FIGS. 5 and 9. Particularly relevant to the present invention, FIG. 9 also illustrates the vertical connection through via 310 made between signal conductors 300 and 400 lying in different planes within the insulative substrate. In this regard it is especially useful to observe the coaxial effect with conductive material in via 310 being surrounded by conductive material in vias 110, 210, 112, 212, 114 and 214. It is noted that the horizontal and vertical scales used in FIG. 9 are not necessarily intended to be an accurate rendition of the dimensions indicated elsewhere but is merely intended to show the desired coaxial structure.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A structure for providing electrical interconnection for integrated circuit chips, said structure comprising:
    an insulative substrate;
    at least one first conductive layer within said insulative substrate, said at least one first conductive layer comprising two sets of parallel conductors non-orthogonally crossing each other and defining non-orthogonal, rhomboid-shaped conductive patterns in said at least one first conductive layer; and
    at least one second conductive layer within said insulative substrate, said at least one second conductive layer being separate from said at least one first conductive layer and comprising two sets of parallel conductors non-orthogonally crossing each other and defining non-orthogonal, rhomboid-shaped conductive patterns in said at least one second conductive layer, said non-orthogonal, rhomboid-shaped conductive patterns of said at least one second conductive layer being displaced in plan view from said non-orthogonal, rhomboid-shaped conductive patterns of said at least one first conductive layer so that vertices of said non-orthogonal, rhomboid-shaped conductive patterns of said at least one first conductive layer are vertically misaligned from vertices of said non-orthogonal, rhomboid-shaped conductive patterns of said at least one second conductive layer.

2. The structure of claim 1 in which said at least one first conductive layer is a ground plane and said at least one second conductive layer is a power plane.

3. The structure of claim 1 in which said insulative structure is glass ceramic.

4. The structure of claim 1 in which said insulative structure is polymeric.

5. The structure of claim 1 further including a plane of conductive signal paths disposed between said at least one first conductive layer and said at least one second conductive layer.

6. The insulative substrate of claim 1 further including integrated circuit chips disposed on at least one surface of said insulative substrate.

7. The structure of claim 1, wherein parallel conductors of the sets of parallel conductors of the at least one first conductive layer and parallel conductors of the sets of parallel conductors of the at least one second conductive layer are spaced according to a common grid spacing, a.

8. The structure of claim 1, wherein the structure further comprises a plurality of first conductive layers and a plurality of second conductive layers, the plurality of first conductive layers comprising the at least one first conductive layer and the plurality of second conductive layers comprising the at least one second conductive layer.

9. The structure of claim 1, further comprising a signal line via disposed vertically misaligned relative to vertices of the non-orthogonal, rhomboid-shaped conductive patterns of the at least one first conductive layer, and vertically misaligned relative to vertices of the non-orthogonal, rhomboid-shaped conductive patterns of the at least one second conductive layer.

10. The structure of claim 1, wherein the two sets of parallel conductors of a first conductive layer of the at least one first conductive layer non-orthogonally cross each other at approximately a 60° angle, and wherein the two sets of parallel conductors of a second conductive layer of the at least one second conductive layer non-orthogonally cross each other at approximately a 60° angle.

11. The structure of claim 7, wherein a distance, v, of misalignment of vertices of said non-orthogonal, rhomboid-shaped conductive patterns of said at least one first conductive layer and vertices of said non-orthogonal, rhomboid-shaped conductive patterns of said at least one second conductive layer, is a function of a.

12. The structure of claim 8, wherein at least two first conductive layers of the plurality of first conductive layers are mirror images of one another, and wherein at least two second conductive layers of the plurality of second conductive layers are mirror images of one another.

13. The structure of claim 11, wherein a distance, d, between conductors of a first conductive layer of the at least one first conductive layer and a position of a signal line via when projected in plan view onto the first conductive layer, is a function of a.

14. The structure of claim 12, wherein at least one first conductive layer of the plurality of first conductive layers is disposed between two second conductive layers of the plurality of second conductive layers.

15. The structure of claim 13, wherein a distance, D, representing an altitude of the non-orthogonal, rhomboid-shaped conductive patterns in said at least one first conductive layer, and an altitude of the non-orthogonal, rhomboid-shaped conductive patterns in said at least one second layer, is a function of a.

16. The structure of claim 15, wherein D is selected to be approximately 0.86a, d is selected to be approximately 0.28a, and v is selected to be approximately 0.57a.

17. A method of fabricating an insulative substrate, the method comprising:

disposing at least one first conductive layer within said insulative substrate, said at least one first conductive layer comprising two sets of parallel conductors non-orthogonally crossing each other and defining non-orthogonal, rhomboid-shaped conductive patterns in said at least one first conductive layer; and disposing at least one second conductive layer within said insulative substrate, said at least one second conductive layer being separate from said at least one first conductive layer and comprising two sets of parallel conductors non-orthogonally crossing each other and defining non-orthogonal, rhomboid-shaped conductive patterns in said at least one second conductive layer, said non-orthogonal, rhomboid-shaped conductive patterns of said at least one second conductive layer being displaced in plan view from said non-orthogonal, rhomboid-shaped conductive patterns of said at least one first conductive layer so that vertices of said non-orthogonal, rhomboid-shaped conductive patterns of said at least one first conductive layer are vertically misaligned from vertices of said non-orthogonal, rhomboid-shaped conductive patterns of said at least one second conductive layer.

18. The method of claim 17 in which said insulative structure is glass ceramic or is polymeric, and further comprises at least one plane of at least one conductive signal path disposed between said at least one first conductive payer and said at least one second conductive layer.

19. The method of claim 17, wherein parallel conductors of the sets of parallel conductors of the at least one first conductive layer and parallel conductors of the sets of parallel conductors of the at least one second conductive layer are spaced according to a common grid spacing, a, and wherein the method further comprises selecting:

a distance, v, of misalignment of vertices of said non-orthogonal, rhomboid-shaped conductive patterns of said at least one first conductive layer and vertices of said non-orthogonal, rhomboid-shaped conductive patterns of said at least one second conductive layer, a distance, d, between conductors of a first conductive layer of the at least one first conductive layer and a position of a signal line via when projected in plan view onto the first conductive layer, and a distance, D, representing an altitude of the non-orthogonal, rhomboid-shaped conductive patterns in said at least one first conductive layer, and an altitude of the non-orthogonal, rhomboid-shaped conductive patterns in said at least one second layer, each as a function of a.

20. The method of claim 17, wherein the method further comprises disposing a plurality of first conductive layers within said insulative substrate and a plurality of second conductive layers in said insulative substrate, the plurality of first conductive layers comprising the at least one first conductive layer and the plurality of second conductive layers comprising the at least one second conductive layer, and wherein at least one first conductive layer of the plurality of first conductive layers is disposed between two second conductive layers of the plurality of second conductive layers.

* * * * *